United States Patent [19]

Ewer et al.

[11] Patent Number: 4,853,762

[45] Date of Patent: Aug. 1, 1989

[54] SEMI-CONDUCTOR MODULES

[75] Inventors: Peter R. Ewer, Hurst Green; Jeffrey R. Ellard, Burgess Hill, both of England

[73] Assignee: International Rectifier Corporation, El Segundo, Calif.

[21] Appl. No.: 28,681

[22] Filed: Mar. 20, 1987

[30] Foreign Application Priority Data

Mar. 27, 1986 [GB] United Kingdom ............... 8607654
Apr. 2, 1986 [GB] United Kingdom ............... 8608094

[51] Int. Cl.⁴ .................. H01L 23/16; H01L 23/32; H01L 23/42
[52] U.S. Cl. ......................................... 357/79; 357/75; 357/76
[58] Field of Search .............. 357/77, 76, 79, 74, 357/75

[56] References Cited

U.S. PATENT DOCUMENTS

| 2,822,512 | 2/1958 | French ............................ 357/79 |
| 4,218,695 | 8/1980 | Egerbacher et al. ............. 357/79 |
| 4,499,485 | 2/1985 | Schierz et al. .................. 357/79 |
| 4,523,219 | 6/1985 | Heidegger et al. ............... 357/79 |
| 4,571,669 | 2/1986 | Tsujii et al. .................... 357/77 |
| 4,574,299 | 3/1986 | Glascock et al. ................ 357/76 |
| 4,634,891 | 1/1987 | Yamagmei ........................ 357/76 |
| 4,694,322 | 9/1987 | Sakurai et al. .................. 357/79 |

FOREIGN PATENT DOCUMENTS 2728564 1/1979 Fed. Rep. of Germany ........ 357/79
3142576 5/1983 Fed. Rep. of Germany ........ 357/79

*Primary Examiner*—J. Carroll
*Attorney, Agent, or Firm*—Ostrolenk, Faber, Gerb & Soffen

[57] ABSTRACT

A semi-conductor element module having a housing contains at least one semi-conductor junction having electrodes electrically connected to respective terminals by compression assembly, the semi-conductor junction and terminals forming elements of a stack contained in the housing and further comprising at least one strain buffer, at least one electrical isolation member, and at least one electrically insulating compression member. Compression forces are applied to the stack by at least one spring means, the height of said stack being less than 15 mm and the module being such that, in use with rated current, the junction temperature is no greater than 130° C. and the housing temperature is no less than 80° C. Furthermore the module has at least two external terminals, the distance between which is adjustable.

12 Claims, 3 Drawing Sheets

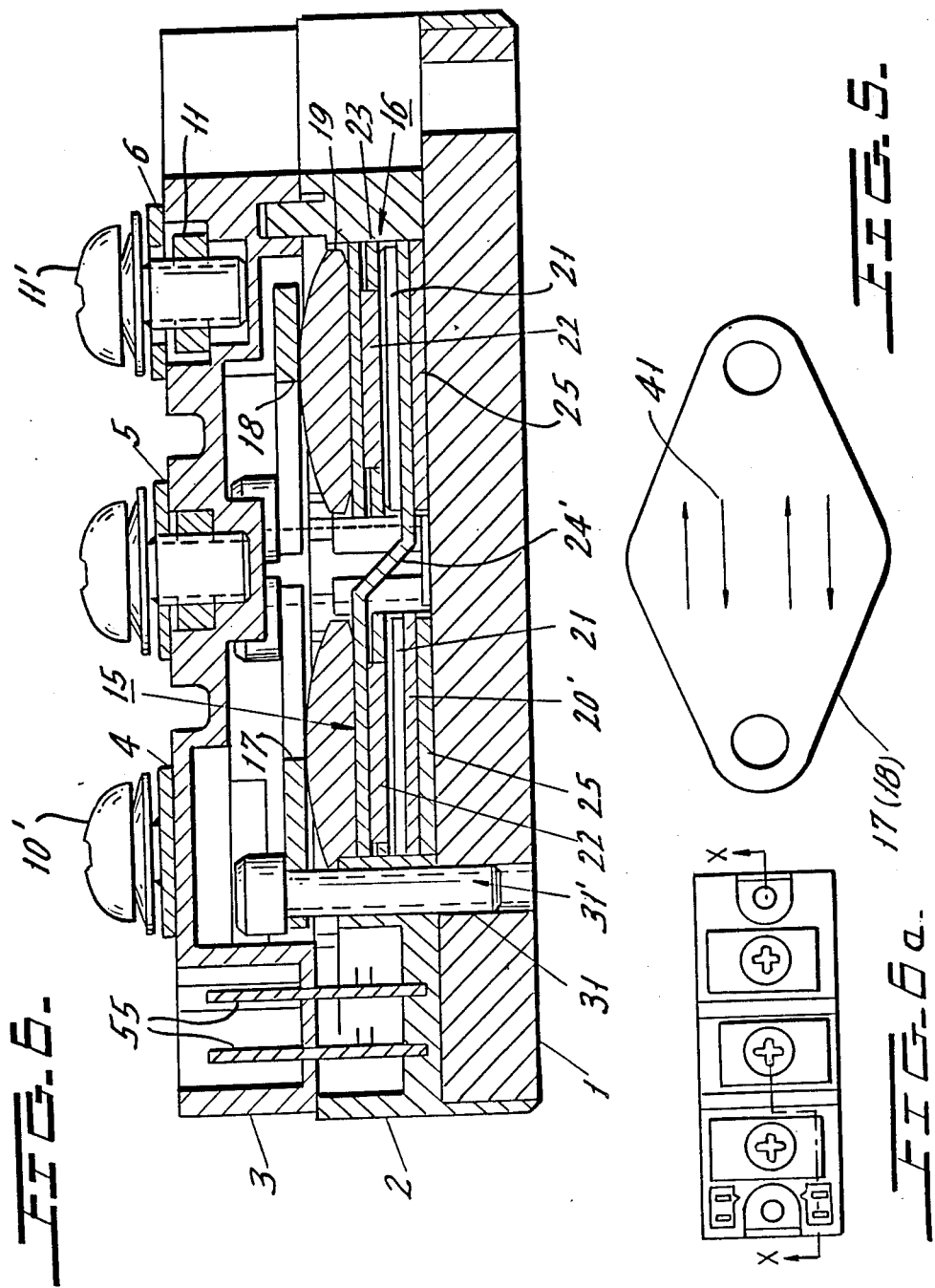

SEMI-CONDUCTOR MODULES

BACKGROUND AND SUMMARY OF THE INVENTION

The present invention relates to semi-conductor component modules, and is particularly but not exclusively applicable to rectifier or thyristor modules.

It is known to provide packages or modules containing a pair of semi-conductor rectifying or thyristor elements connected in series on a base from which these are electrically isolated. External contacts are provided on the package to enable electrical connection to all three terminals of the series connection of two elements.

Two such packages may be externally connected together to form a full wave rectifying bridge, and similarly three such packages may be interconnected to form a three phase rectifying arrangement.

Such modules or packages are commercially available in various standard sizes and also the spacing between the external terminals has become standardized. However, unfortunately, different manufacturers adopt differing sizes and standards. Thus, manufacturers of such packages or modules are presently forced either to offer two completely separate ranges of module or must concentrate on only a single range. Both options are commercially disadvantageous.

To be more specific, one known standard thyristor module of 130A nominal rating has an overall height of 30 mm and a terminal spacing of 23 mm. A second known equivalent standard module has an overall height of 41 mm and a terminal spacing of 25 mm.

When a plurality of modules of the first standard are connected together by heavy duty copper rods or the like, it is difficult if not impossible to replace a single module by another of the other standard even though its electrical properties may be perfectly adequate. Problems arise owing to the difference in height and the difference in terminal spacing.

According to one aspect of the invention, there is provided a semi-conductor element module having at least two external terminals, the distance between said terminals being adjustable Another problem is concerned with the internal assembly method adopted for the modules. The semiconductor elements within the module may be electrically connected to terminals and other components either by means of soldering or by means of compression bonding. It will be appreciated that whichever method is adopted it is necessary in high power applications for these interconnections to pass a relatively large current without appreciable voltage drop, whilst maintaining the housing and junction temperatures within certain limits.

Both methods of connection have their advantages and disadvantages. Whilst a soldered assembly requires fewer components, produces better thermal characteristics and simplifies the housing, as well as rendering the production of a lower assembly more easy, it has disadvantages in that the terminals will be more complex, furnace operations are required, thermal expansion and mis-match can be expected and there are various problems with loss of yield. The selection of solder assembly is not accepted as readily by customers as is the compression bonded product.

It will be appreciated from the above that manufacturers generally prefer to adopt the compression bonded technique when this is feasible having regard to dimensional constraints of the finished package.

However it has previously proved impossible to provide a satisfactory compression assembled product of relatively low overall height.

According to a further aspect of the invention, there is provided a semi-conductor element module having a housing containing at least one semi-conductor junction having electrodes electrically connected to respective terminals by compression assembly, the semiconductor junction and terminals forming elements of a stack contained in the housing and further comprising at least one strain buffer, at least one electrical isolation member, and at least one electrically insulating compression member, compression forces being applied to the stack by at least one spring means, the height of said stack being less than 15 mm and the module being such that, in use with rated current, the junction temperature is no greater than 130° C. and the housing temperature is no less than 80° C.

Preferably, the spring means comprises a leaf or plate spring member.

Preferably, the each isolation member consists of alumina oxide or aluminium nitride.

Preferably, the compression member consists of ceramic, e.g. aluminium oxide, or mica.

The leaf or plate spring mentioned above is preferably of lozenge shape to even out the stresses applied to the spring element.

Preferably, the strain buffer is of molybdenum, tungsten or copper.

BRIEF DESCRIPTION OF THE DRAWINGS

For a better understanding of the invention, and to show how the same may be carried into effect, reference will now be made by way of example to the accompanying drawings, in which:

FIG. 5 is a plan view of a plate spring; and

FIG. 6 is a longitudinal sectional view along section line X—X of FIG. 6a of a modified embodiment.

DESCRIPTION OF THE PREFERRED EMBODIMENTS

Figure 1:
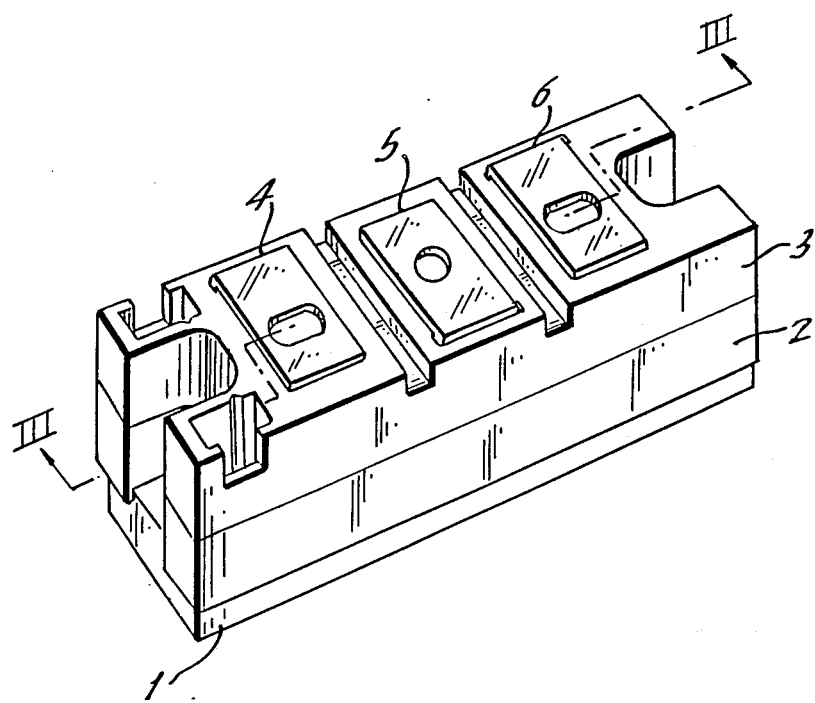
FIG. 1 is a perspective view of a semi-conductor element module assembly in accordance with one embodiment of the invention.

Referring now to FIG. 1 in more detail, the illustrated module assembly comprises a base plate 1 consisting of nickel plated copper and providing two mounting holes for customer use in addition to four tapped holes for spring retaining screws, these various holes not appearing in FIG. 1. Preferably, the base member should have a thickness of 8 mm for compatibility with commercially existing modules, but this can be reduced to 7 or 6 mm if necessary to provide additional space within the assembly. Of course, when reducing its thickness in this manner it must be ensured that an unacceptable degree of bowing under stress and creep does not occur.

It may also be possible to replace the copper base by a base of anodized aluminium in order to improve electrical isolation properties of the module.

Mounted on the base 1, there is provided a moulded case of synthetic plastic material comprising a lower part 2 and an upper part or lid 3.

In FIG. 1, it may be clearly seen that three external contacts 4, 5 and 6 extend across the upper surface of the lid 3. Each contact provides an aperture for receiving a terminal screw, these apertures being elongated in the case of terminals 4 and 6 for a purpose which will be explained hereinafter.

Figure 2:
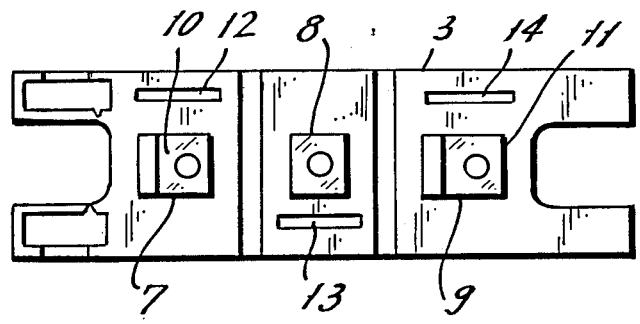
FIG. 2 is a plan view of an upper housing portion of the assembly of FIG. 1.

Referring now to FIG. 2, the upper surface of the lid 3 beneath the terminal members 4, 5 and 6 may be seen in more detail. It may be seen that the upper surface of the lid 3 provides three rectangular recesses 7, 8 and 9 along the longitudinal centre line. Each recess contains a respective square nut for receiving a terminal screw. The two outermost nuts 10 and 11 are clearly slidable longitudinally of the lid by virtue of the fact that the recesses for these nuts are elongated. The purpose of this measure will be explained hereinafter.

FIG. 2 also illustrates three slots 12, 13 and 14 for receiving the respective terminal members 4, 5 and 6, which are L-shaped.

Figure 3:
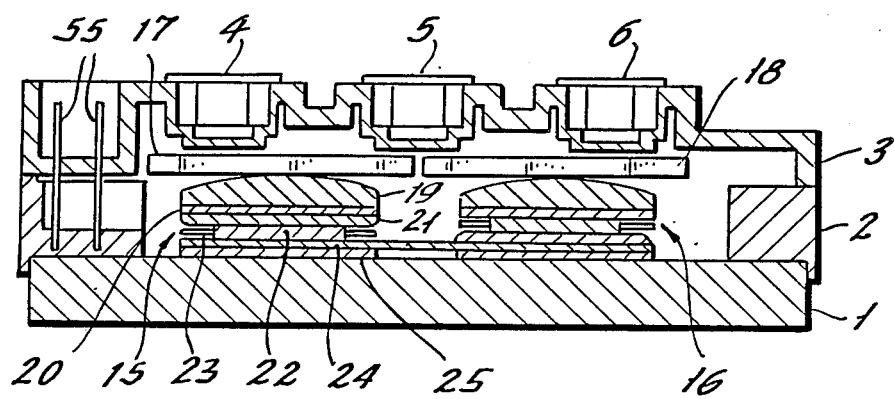
FIG. 3 is a longitudinal sectional view along the line III—III of the assembly illustrated in FIG. 1.

Reference will now be made to FIG. 3. In this longitudinal sectional view, the individual components of two semi-conductor rectifier stacks 15 and 16 may be clearly seen.

Each stack is compressed in a vertical direction by means of a respective leaf spring 17 or 18. Considering the left hand stack 15, a compression disk 19 of aluminium oxide or mica is placed beneath the spring 17. The maximum thickness of this disk is 4 mm, this dimension offering the best compromise between height and strength. The upper surface of the disk is domed to enable the spring loading to be applied centrally and floatingly. This also permits the use of a flat spring which bends down under load and thereby provides greater height clearance. Beneath the disk 19, is provided an upper electrical terminal 20 of 1 mm copper sheet. Beneath terminal 20, there is provided a semiconductor thyristor junction 21. This junction is preferably of the type having a ring gate, but centre gate junctions may also be used with appropriate modification to the assembly. Beneath the semi-conductor junction 21 is a molybdenum or copper or tungsten disk 22, used as a strain buffer, is centralized by means of a washer 23 of polytetrafluoethylene. Beneath the molybdenum disk is disposed a lower electrical connection terminal 24 of 1 mm copper sheet. This lower terminal 24 extends across to the second rectifier stack 16. Beneath the terminal 24 is located an isolation pad 25 electrically insulating the stack from the heat conducting base 1. This insulation pad must ensure that electrical isolation remains effective to 2,500 volts rms. This requires a minimum thickness of 1.5 mm. This thickness is also suitable to provide adequate mechanical strength. The isolation pad is preferably of alumina oxide or aluminium nitride. The use of beryllium oxide is also possible however.

The right hand stack 16 illustrated in FIG. 3 is basically the same as the left hand stack 15 but the positions of the semi-conductor junction and the molybdenum disk are reversed Although not specifically illustrated in FIG. 3, it will be appreciated that internal wiring interconnects external terminal member 4 with internal terminal 20 and that external terminal member 6 is similarly connected to the corresponding terminal in the right hand stack 16. The central external terminal member 5 is connected to the lower internal terminal 24.

It will also be appreciated that the two leaf or plate springs 17 and 18 are secured to the lower heat conducting base member 1 by a pair of screws passing through respective apertures adjacent the ends of each spring as illustrated in FIG. 5.

The use of lozenge shaped plate springs is particularly advantageous as against the use of disk springs since lozenge shaped plate springs are less liable to relaxation.

For improved electrical isolation, the remaining space within the housing is filled with silicone rubber.

The base plate 1 must ensure not only good lateral heat spreading, but also must remain flat to within about 20 microns during manufacturing thus to ensure consistently low contact thermal resistance from the semiconductor junctions to the heat sink.

The two housing parts 2 and 3 are connected together by an adhesive and similarly the lower housing part 2 is secured to the base plate 1 by means of an adhesive.

As regards the dimensions of the various components, it has already been mentioned that the maximum thickness of the ceramic compression disks 19 is 4 mm and that the internal terminals are of 1 mm copper sheet. The semi-conductor junctions are preferably of 23 to 24 mm diameter. The molybdenum disks 22 are each of 1.5 mm thickness and a similar thickness is employed for the isolation pads 25. By use of plate springs 17 and 18 having a thickness of 2.5 mm, it is thus possible to easily achieve an overall height of 30 mm even using the compression assembly technique, the stack height being 10 mm.

The lid 3 has an overall height of 11 mm and the total vertical height from the top of the lower housing component 2 to the bottom of the base 1 is 18 mm.

It has already been mentioned that the nuts 10 and 11 are slidable longitudinally and this enables the spacing of external terminal screws to be adjusted to suit various commercial standards. In FIG. 2, both nuts 10 and 11 are illustrated in a right hand position. This is for illustration purposes only. In reality, of course, the terminal nuts 10 and 11 would normally be placed symmetrically relative to the central recess 8.

Figure 4:
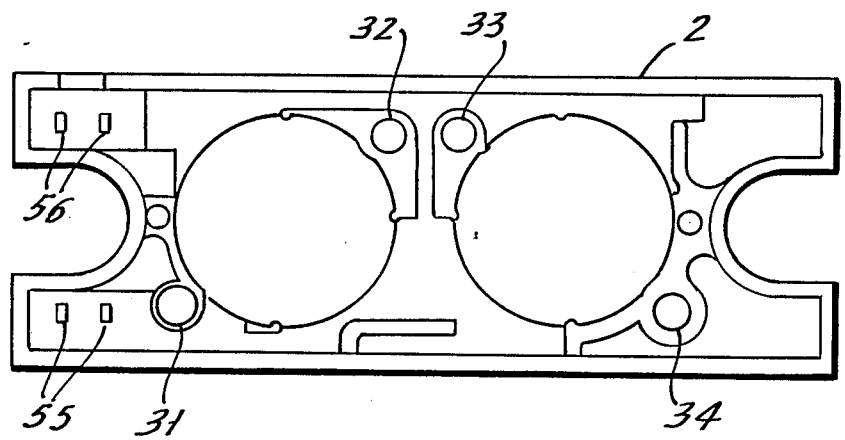
FIG. 4 is a plan view of a lower housing portion of the assembly of FIG. 1.

Referring now to FIG. 4, which illustrates a plan view of the lower housing component 2, the position of the fixing holes for the plate springs 17 and 18 may be clearly observed. The left hand plate spring has fixing holes 31 and 32, and the right hand plate spring has fixing holes 33 and 34.

FIG. 5 illustrates the shape of each leaf or plate spring 17 and 18. Arrows 41 illustrate the direction of the grain flow in the material of the spring, which is preferably stainless steel.

It will be appreciated that the properties of the spring are extremely important in maintaining an adequate compression force between the components of the two stacks 15 and 16. Not only must the force be adequate upon manufacture, but it must be maintained over the operational lifetime of the modules. Such springs can readily be produced by persons skilled in the art.

It will be appreciated that the modules described and illustrated in this specification are suitable for various applications. Two such modules may be positioned side-by-side and interconnected by copper connecting rods to form a bridge circuit for high power full wave rectification purposes.

Similarly, three such modules may be interconnected to provide a three phase rectifier.

It is of course already well known to form bridge circuit and rectifier circuits using modular assemblies. Unfortunately, however, the industry has not achieved a commonly accepted standard. The result is that modules of various heights and various upper terminal spacing exist. It is not possible to replace a module of one standard by a module of a different standard owing both to the fact that the differing standards have differing heights and also owing to the fact that the various standard have different spacing between the upper terminals.

The module described in this specification is, however, able to meet all the industrial standards for the following reasons.

First of all, its overall height is no greater than the lowest comparable module available on the market. This is achieved despite of the use of compression assembly techniques rather than soldering techniques which are generally disfavored. The problem of varying terminal spacing is overcome by means of the slidable nut construction illustrated particularly in FIG. 2.

When a module of greater height is to be replaced by a module according to the present invention, it is simply necessary to provide an auxiliary shim or spacer to bring the module to the desired height.

The control gates of the thyristor elements 21 are of course also connected to external terminals such as terminals 55 of FIG. 3 and 4. Further external terminals 56 are available for connection to auxiliary gates, when provided.

Of course, thyristor elements 21 may be replaced by diodes, in which case terminals 55 and 56 are unnecessary.

It will be appreciated that where the semiconductor junctions are diodes, the normal current rating is 160A nominal, whereas with thyristors the current rating is 130A nominal. The module should be so designed that with the noted current the junction temperature is less than 130° C., preferably less than 125° C., and the casing temperature is greater than 80° C., preferably greater than 85° C. Even with these restraints, and using compression assembly, it has been found possible, according to the invention, to achieve an overall stack height less than 15 mm, in fact 10 mm, the height of the stack being measured from the base of the leaf spring 17 or 18 to the top surface of the base plate 1. As a result, the overall module height can be maintained less than 35 mm, in fact about 30 mm.

FIG. 6 shows a longitudinal sectional view, (along section line X—X of FIG. 6a), of a modified embodiment of semi-conductor module. In this Figure, parts and components corresponding to those illustrated in FIGS. 1 to 5 are provided with the same reference numerals. The following description will therefore be restricted to the points of difference.

Basically, each rectifier stack 15 and 16 in FIG. 6 corresponds to the right hand rectifier stack illustrated in FIG. 3. Thus, in each rectifier stack of FIG. 6 the semi-conductor junction 21 is located beneath the molybdenum disk 22 and is directly in contact with the lower copper terminal. Since both rectifier stacks are identical, however, the interconnection between the two stacks is different. Whereas in FIG. 3 the two lower copper terminals are linked together to form a common lower terminal member 24, in FIG. 6 the lower terminals are not interconnected. Instead, the lower terminal of the right hand stack 16 is electrically connected with the upper terminal of the left hand stack 15 to form a common connection terminal member 24'. The lower terminal of the left hand stack 15 has the reference numeral 20' in FIG. 6.

FIG. 6 is also illustrative of the manner in which the terminal screws 10' and 11' are engaged with the slidable nuts of the outer terminals, nut 11 being shown in section. The Figure furthermore illustrates one of the securigg screws 31' which engages in the fixing hole 31.

Also in the embodiment of FIG. 6, the same dimensional restraints as discussed above in respect of FIG. 3 may be achieved.

Although the present invention has been described in connection with a preferred embodiment thereof, many variations and modifications will now become apparent to those skilled in the art. It is preferred, therefore, that the present invention be limited not by the specific disclosure herein, but only by the appended claims.

We claim:

1. A semi-conductor element module having a housing containing at least one semi-conductor junction having electrodes electrically connected to respective external terminals by compression assembly, the semi-conductor junction and a pair of internal terminals forming elements of a stack contained in the housing; said stack further comprising at leas tone solid strain buffer having one side adjacent one side of the semi-conductor junction, at least one electrical isolation member dielectrically spacing the stack from the housing, and at least one electrically insulating compression member having a domed surface and being limited in maximum thickness to 4 mm; one of said internal terminals being adjacent another side of the semi-conductor junction and the other internal terminal being adjacent another side of said strain buffer; compression forces being applied to the stack by at least one plate spring means pressing upon said domed surface, the height of said stack being less than 15 mm.

2. A module according to claim 1 wherein said plate spring means has a maximum thickness of 2.5 mm.

3. A module according to claim 1 wherein said strain buffer is selected from the group consisting of molybdenum, tungsten or copper.

4. A module according to claim 1 wherein each isolation member is selected from the group consisting of alumina oxide or aluminum nitride.

5. A module according to claim 1 wherein said compression member is a ceramic.

6. A module according to claim 1 wherein said plate spring member is of lozenge shape with the center of the spring member substantially centered on said domed surface.

7. A module according to claim 1 wherein said stack height is less than 12 mm.

8. A module according to claim 7 wherein said stack height is about 10 mm.

9. A module according to claim 1 wherein the height of said housing is below about 35 mm.

10. A module according to claim 1 wherein said junction has a diameter of 23 to 24 mm.

11. A module according to claim 1 further including means for adjusting the distance between a pair of said external terminals.

12. A module according to claim 11 wherein said means for adjusting said distance includes means for continuously adjusting said distance to any desired value over a predetermined range of values.

* * * * *